United States Patent
Hsu et al.

(10) Patent No.: US 7,161,826 B2
(45) Date of Patent: Jan. 9, 2007

(54) LOW-NOISE LEAKAGE-TOLERANT REGISTER FILE TECHNIQUE

(75) Inventors: Steven Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/879,090

(22) Filed: Jun. 30, 2004

(65) Prior Publication Data

US 2006/0013035 A1    Jan. 19, 2006

(51) Int. Cl.
*G11C 11/00* (2006.01)
(52) U.S. Cl. .................. 365/154; 365/189.03
(58) Field of Classification Search .............. 365/154
See application file for complete search history.

(56) References Cited

U.S. PATENT DOCUMENTS 5,502,683 A * 3/1996 Marchioro ............. 365/230.05
5,590,087 A * 12/1996 Chung et al. .......... 365/230.05
5,618,473 A * 4/1997 Sauter et al. ............ 261/114.1
5,886,942 A * 3/1999 Akita .................. 365/230.06
5,951,702 A * 9/1999 Lim et al. .................. 365/200
RE36,404 E * 11/1999 Kameda et al. ........ 365/230.06
6,011,746 A * 1/2000 Oh ....................... 365/230.06
6,088,267 A * 7/2000 Atsumi et al. .......... 365/185.23
6,885,595 B1 * 4/2005 Sumita .................... 365/191
2004/0139271 A1 * 7/2004 Khellah et al. .............. 711/1

* cited by examiner

*Primary Examiner*—Thong Q. Le
(74) *Attorney, Agent, or Firm*—Fleshner & Kim, LLP.

(57) ABSTRACT

A memory circuit includes a word line, a data storage circuit including one or more memory cells or sub-cells, and an inverter coupled between the word line and the N memory cells. The inverter inverts a word-line signal input into a read port of the cells or sub-cells. Because the word-line inverter is local to each cell or sub-cell, DC offset is substantially reduced which translates into a reduction in leakage current.

24 Claims, 4 Drawing Sheets

LOW-NOISE LEAKAGE-TOLERANT REGISTER FILE TECHNIQUE

FIELD

This invention relates in at least one of its embodiments to digital circuits, and more particularly to data storage circuits.

BACKGROUND OF THE INVENTION

As device technology scales to smaller dimensions, leakage current may present problems if circuits are not properly designed. For example, leakage current may have an adverse effect on circuit robustness, which, in turn, may substantially diminish system reliability and performance.

Register files are particularly vulnerable to leakage current. Register files are basic building blocks in microprocessor systems, with modern designs having over 80. A source of leakage current in a register file system is DC offset, and particularly word-line DC offset as explained in greater detail below.

Conventional register files include a series of memory cells connected to a common word line. Up to 64 cells may be connected to the word line and all may be driven by the same word-line driver. In order to drive this number of cells with one driver, a long word line must be used. These word lines are typically 500 µm in length in a 0.13 µm technology node.

In this arrangement, the word-line driver is grounded by connecting an inverter within the driver circuit to some reference potential. Because of the length of the word line, the ground of far-end memory cells may be at a lower potential than the ground on the word-line driver. Such a potential difference (referred to as DC offset) will have the effect of increasing the leakage current exponentially on the associated bit lines. Since the bit lines are dynamic in nature, any increase in leakage current will necessarily affect the performance and reliability of the entire file in terms of its ability to accurately store data.

DESCRIPTION OF THE PREFERRED EMBODIMENTS

Figure 1:
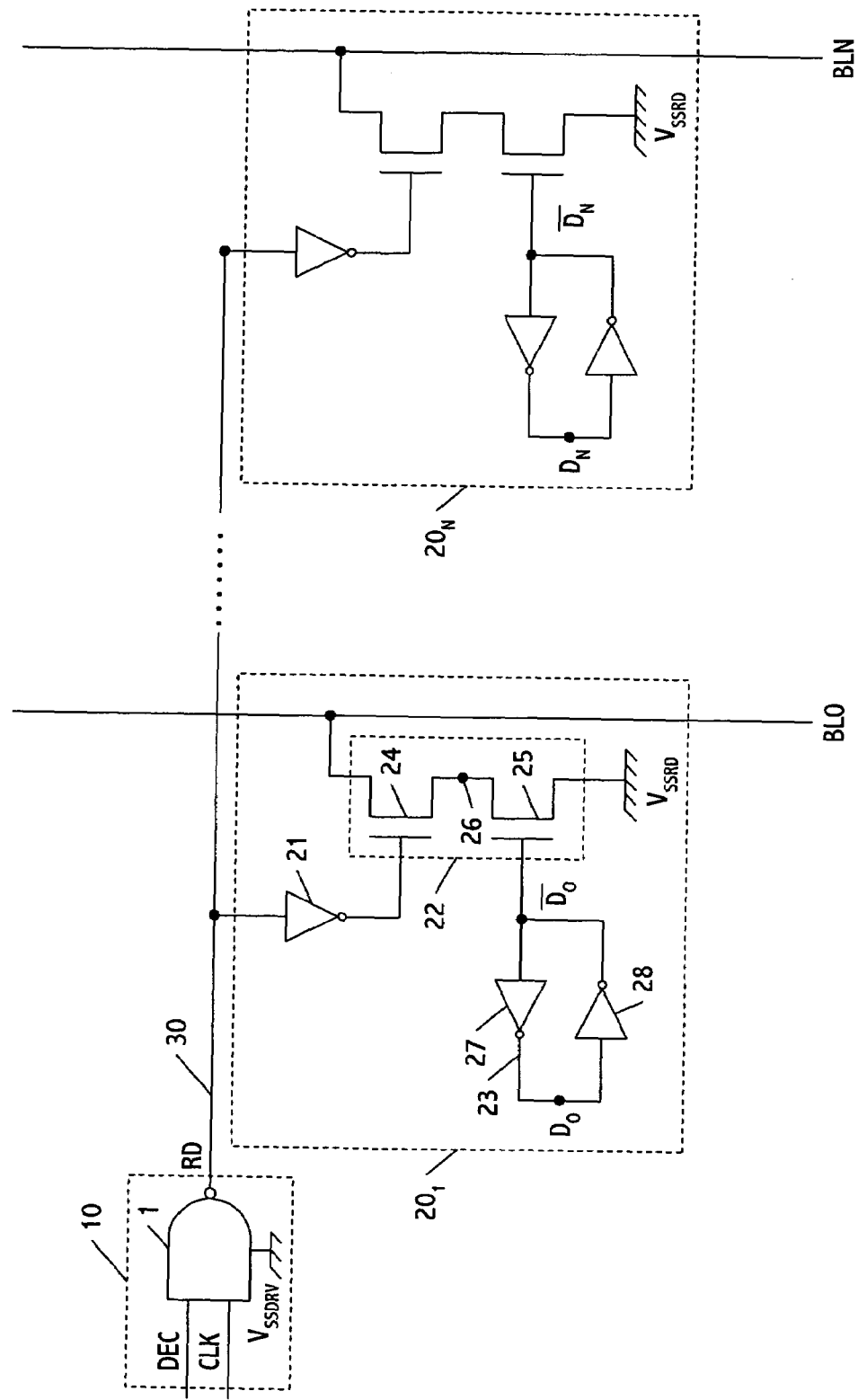
FIG. 1 is a diagram showing a memory circuit in accordance with one embodiment of the present invention.

FIG. 1 shows a memory circuit in accordance with one embodiment of the present invention. This circuit includes a word-line driver 10 and a series of memory cells $20_1$–$20_N$ coupled to a common word line 30. When arranged in this manner, the memory circuit may form a register file to be used in and/or accessed by a microprocessor, or may form a storage location in any one of a number of memory devices including but not limited to SRAMs, DRAMs, CAMs, and ROMs. The register or storage location may be included on or off the same chip or die on which the microprocessor is formed.

The word-line driver includes a logic gate 1 which receives at least two inputs, a clock signal clk and a decoder signal dec, the latter of which corresponds to the output of the decoder which selects a word line for a single address. Based on these inputs, the logic gate generates a read signal (rd) for driving the memory cells along the word line. The ground, VSSDRV, for the word-line driver may be coupled or even directly connected to the logic gate, which may be a NAND gate or some other combination of logic.

The memory cells preferably have a common design which includes an inverter 21, a read port 22, and a storage circuit 23. The inverter is coupled between the word line and read port, the latter of which is formed from an access transistor 24 and a pass transistor 25 connected in series. The access transistor is coupled to the inverter through its gate terminal and to a bit line BL0 through its source or drain terminal. The pass transistor is coupled to the storage circuit through its gate terminal and to a reference potential (e.g., ground), VSSRD, through its source or drain terminal. This same reference potential may be used to ground the inverter. The remaining terminals of the access and pass transistors are coupled to a node 26.

The storage circuit may take any one of a variety of forms. In this embodiment, the storage circuit includes a keeper circuit formed from cross-coupled inverters 27 and 28. Opposing nodes between these inverters store complementary logic values. These values are represented as $D_0$ and in memory cell $20_1$ and $D_N$ and in memory cell $20_N$. In other embodiments, the storage circuit may be formed from a trench or MOS capacitor or a cross-coupled inverter.

In operation, the word-line driver generates a read signal from the clock and decoder signals clk and dec. This signal is then inverted by inverter 21 in each of the memory cells, and the resulting signal is input into the gate of the access transistor. When this transistor turns on, the pass transistor passes a voltage corresponding to logical value to an associated bit line BL0 through the access transistor. During a write operation, a voltage corresponding to a specific logical value is passed from the bit line through the access and pass transistors for storage onto the nodes of the keeper circuit. (In accordance with at least one embodiment described herein, bit line BL0 may initially be pre-charged when word line WL=0. When WL=1, transistor 24 turns on. Thus, regardless of whether transistor 25 is on or not, BL0 is either discharged or remains high).

Figure 2:
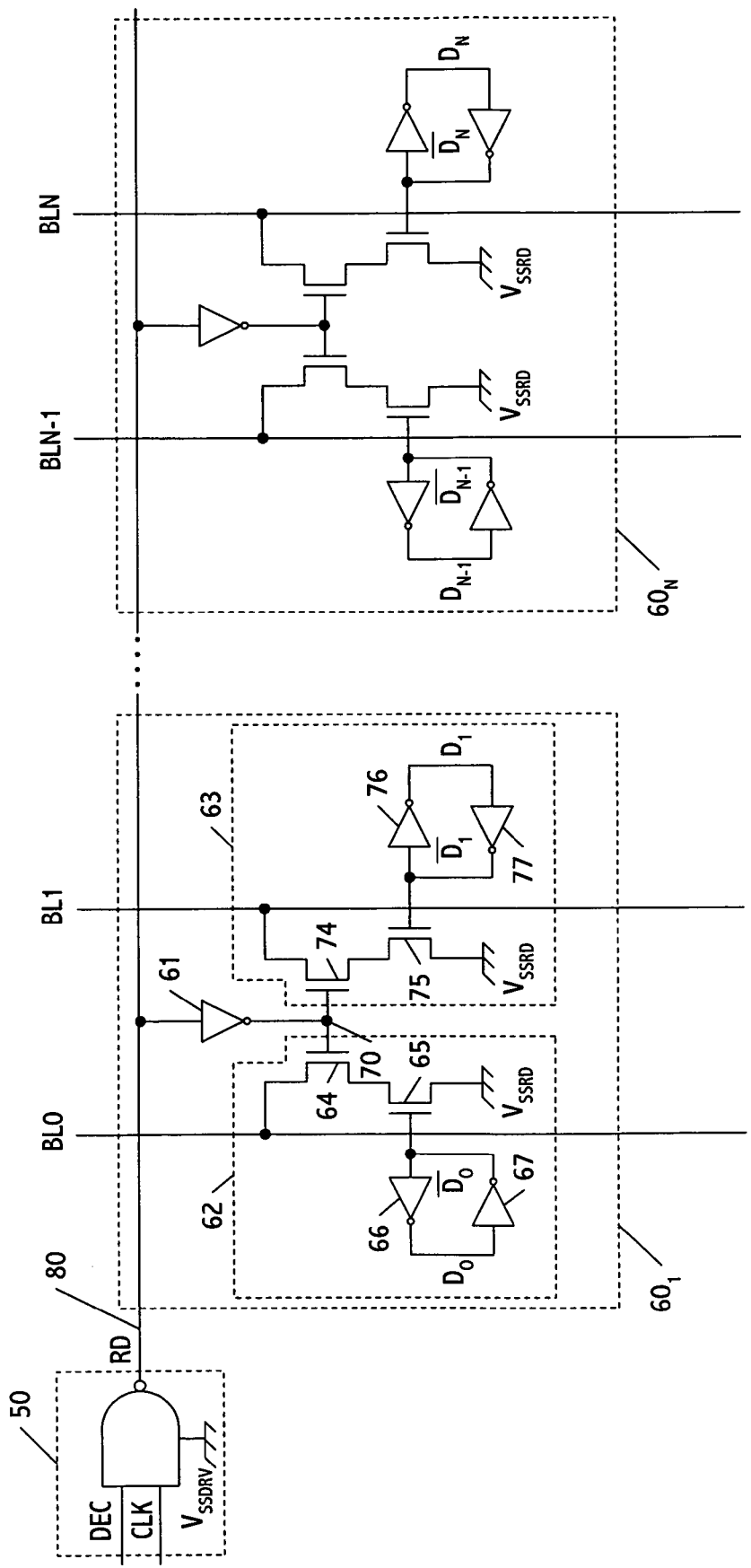
FIG. 2 is a diagram showing a memory circuit in accordance with another embodiment of the present invention.

FIG. 2 shows a memory circuit in accordance with another embodiment of the present invention. This circuit includes a word-line driver 50 and a series of memory cells $60_1$–$60_M$ coupled to a common word line 80. Like in the previous embodiment, the memory circuit may form a register file or storage location of a memory. Also, the word-line driver may be the same as the word-line driver previously discussed. Unlike the previous embodiment, however, each memory cell includes two or more storage locations. For illustrative purposes, only two storage locations are shown.

The memory cells may have a common design which includes an inverter 61, a first sub-cell 62, and a second sub-cell 63. The inverter is coupled between the word line and a node 70 located between the sub-cells. Node 70 preferably connects the read ports of the sub-cells.

Sub-cell 62 includes a read port and a data storage unit. The read port is formed from access and pass transistors 64 and 65, and the data storage unit is preferably a keeper circuit formed from cross-coupled inverters 66 and 67. A source or drain of the access transistor is coupled to a bit line BL0, and gate of the pass transistor is coupled to the keeper circuit.

Sub-cell 63 also includes a read port and a data storage unit. The read port is formed from access and pass transistors 74 and 75, and the data storage unit is preferably a keeper circuit formed from cross-coupled inverters 76 and 77. A source or drain of the access transistor is coupled to a bit line BL1, and gate of the pass transistor is coupled to the keeper circuit. Gates of the access transistors in sub-cells 62 and 63 are coupled to inverter 61 though common node 70. Also, the pass transistors are preferably connected to the same reference potential (e.g., ground), VSSRD, which also may form the ground for inverter 61.

In operation, a read signal generated from the word-line driver is inverted by inverter 61 in each of the memory cells. The resulting signal is then input into the gates of the access transistors in the adjoined sub-cells. When the access transistors turn on, the associated pass transistors pass voltages corresponding to logical values and to bit line BL0 and BL1, respectively, through the access transistors. During a write operation, voltages corresponding to specific logical.

In the embodiments of the memory circuit described herein, the word-line inverter is located inside or local to each memory cell. When located in this manner, there is little, if any, potential difference between the inverter and read port ground in each memory cell. As a result, a low-noise topology is provided with substantially reduced DC offset in the word line. Moreover, the reduction in DC offset is achieved regardless of the length of the word line and of where the cell is coupled to the word line. Reducing, or eliminating, DC offset in this manner translates into a reduction in leakage current on the bit lines and other portions of the circuit, thereby enhancing performance and reliability.

Figure 3:
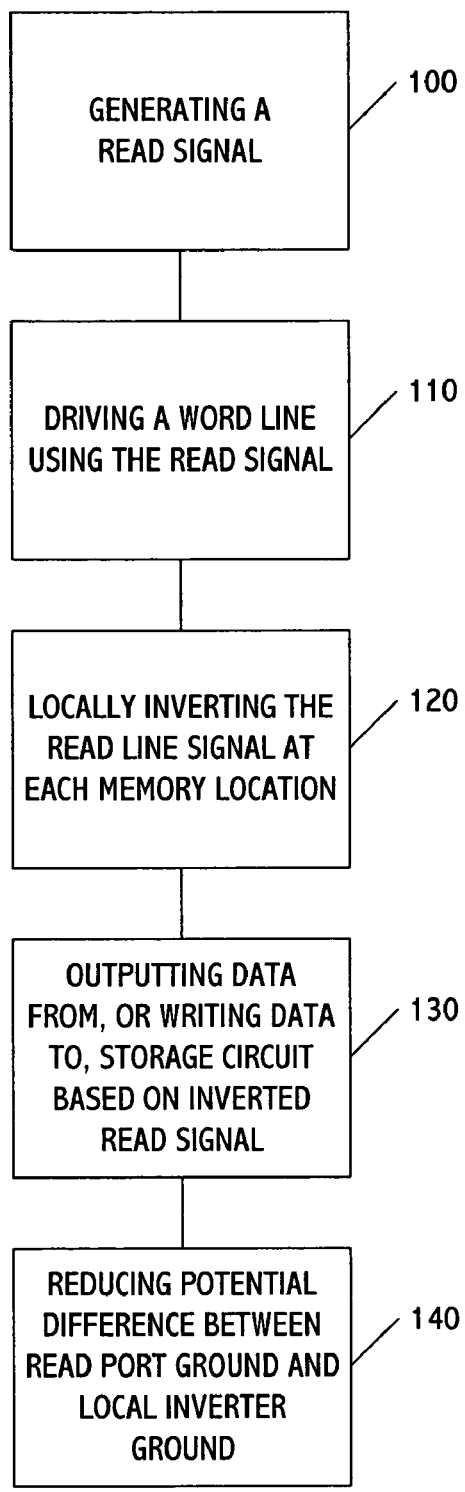
FIG. 3 is a flow diagram including functional blocks included in one embodiment of a method for reducing leakage current in a memory circuit in accordance with the present invention.

FIG. 3 is a flow diagram including functional blocks included in one embodiment of a method for reducing leakage current in a memory circuit in accordance with the present invention. The method includes generating a read signal from clock and decoder signals (Block 100) and then driving a word line using the read signal (Block 110). At each memory circuit coupled to the word line, the read signal is inverted by a local inverter. (Block 120). The inverted read signal is then input into one or more read ports included in the memory circuit, and voltage(s) corresponding to logical value(s) are output from one or more associated data storage circuits (Block 130). The read port and inverter may be grounded using the same reference potential (Block 140), to thereby reduce or altogether eliminate DC offset and thus leakage current in the circuit.

The reduction or elimination in DC offset achieved by the embodiments described herein increase the robustness of the memory circuit to leakage effects. In these embodiments, drop-in replacement for dynamic logic chains (e.g., one that are domino compatible) may be achieved with only minimal changes in timing plan. A fully time-borrowable leakage-tolerant domino technique may therefore be employed. Also, an improved edge rate may be realized at the gate of the access transistor, and also an improved performance at high-$V_t$ robustness may be realized. All of these improvements may be used as a basis for forming register file designs which are more aggressive in speed compared with other proposed designs, since the DC offset of the word line can be substantially reduced.

Figure 4:
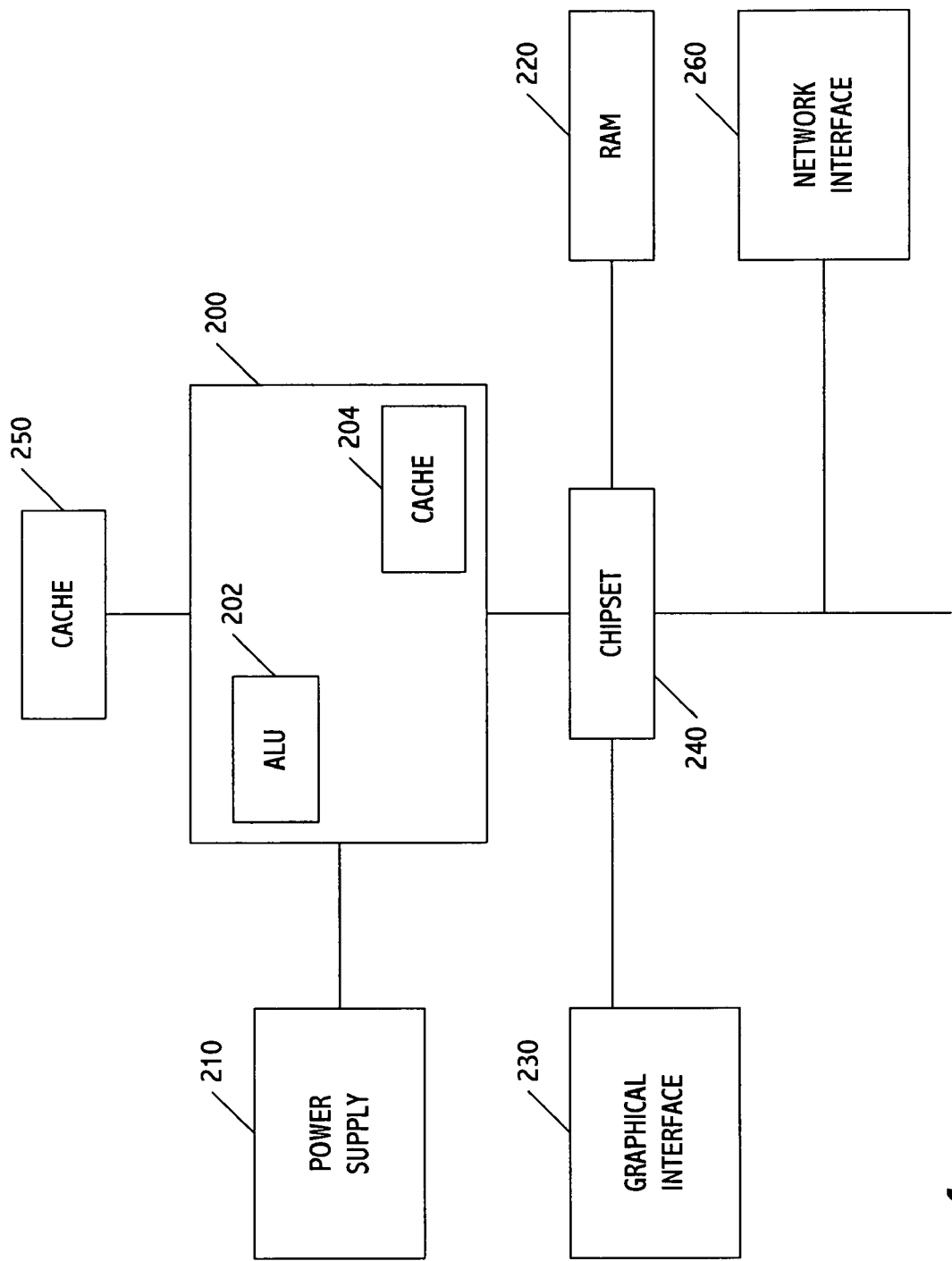
FIG. 4 is a diagram showing a processing system which may include one or more embodiments of the memory circuit of the present invention.

FIG. 4 shows a processing system which corresponds to another application of the timing circuit. In accordance with one embodiment, the processing system includes a processor (e.g., a microprocessor) 200, a power supply 210, and a memory 220 which, for example, may be a random-access memory. The processor may include an arithmetic logic unit 202 and an internal cache 204. In addition to these elements, the processing system may optionally include a graphical interface 230, a chipset 240, a cache 250 and a network interface 260. The processing system may be formed on a single chip die or one or more elements of the system may reside off-chip.

In this system, a memory circuit in accordance with one or more of the embodiments of the present invention may be used as a basis for forming one or more register files to be used in and/or accessed by the processor structure. Additionally, or alternatively, a memory circuit of this type may be used to form the cache or memory circuits. The voltage regulator may also be located off-chip of the microprocessor.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A memory circuit, comprising:
   a word line; and
   a plurality of memory cells coupled to the word line, each cell including:
   (a) N data storage circuits, where $N \geq 1$ and wherein each of the data storage circuits includes a read port and a circuit to store a voltage corresponding to a logical value received from a bit line, the read port including an access transistor coupled to the word line and a pass transistor coupled between the access transistor and the circuit to store said voltage corresponding to the logical value received from the bit line; and
   (b) an inverter coupled between the word line and the N data storage circuits.

2. The memory circuit of claim 1, wherein the inverter inverts a signal on the word line and inputs the inverted signal into the N data storage circuits.

3. The memory circuit of claim 1, wherein the circuit to store said voltage corresponding to the logical value received from the bit line is a keeper circuit.

4. The memory circuit of claim 1, wherein the access transistor has a first terminal coupled to the word line and a second terminal coupled to a bit line.

5. The memory circuit of claim 4, wherein the first terminal is a gate and the second terminal is one of a source and drain.

6. The memory circuit of claim 4, wherein the pass transistor has a first terminal connected to the keeper circuit and a second terminal coupled to a reference potential.

7. The memory circuit of claim 6, wherein the access and pass transistors have third terminals coupled to one another.

8. The memory circuit of claim 3, wherein the keeper circuit includes:
a first node;
a second node; and
cross-coupled inverters connected between the first and second nodes,
wherein the first node stores the voltage corresponding to said logical value and the second node stores a complement of the logical value.

9. A memory circuit, comprising:
a word line; and
one or more memory cells each including:
(a) N data storage circuits wherein N≧2;
(b) an inverter coupled between the word line and the N data storage circuits, wherein each of the N data storage circuits includes a read port and a keeper circuit to store a voltage corresponding to a logical value received from a respective one of a plurality of bit lines; and
(c) a node connecting the read ports of the N data storage circuits to the inverter, each of the read ports including an access transistor coupled to the inverter and a pass transistor coupled between the access transistor and the keeper circuit.

10. The memory circuit of claim 9, wherein the inverter inverts a signal on the word line and inputs the inverted signal into the N data storage circuits.

11. The memory circuit of claim 9, wherein the access transistor has a first terminal coupled to the inverter and a second terminal coupled to said respective bit line.

12. The memory circuit of claim 11, wherein the first terminal is a gate and the second terminal is one of a source and drain.

13. The memory circuit of claim 11, wherein the pass transistor has a first terminal connected to the keeper circuit and a second terminal coupled to a reference potential.

14. The memory circuit of claim 13, wherein the access and pass transistors have third terminals coupled to one another.

15. The memory circuit of claim 9, wherein the keeper circuit includes:
a first node;
a second node; and
cross-coupled inverters connected between the first and second nodes,
wherein the first node stores the voltage corresponding to said logical value and the second node stores a complement of the logical value.

16. A method, comprising:
driving a memory circuit based on an inverted word line signal; and
reducing a potential difference between a read port ground of the memory circuit and a ground of an inverter which generates the inverted word line signal, the memory circuit including a plurality of memory cells coupled to the word line, each cell including N data storage circuits, where N≧1, wherein reducing said potential difference includes coupling the inverter in each memory cell between the word line and the N data storage circuits.

17. The method of claim 16, wherein the read port ground and inverter ground are a same ground.

18. The method of claim 16, where N≧2.

19. The method of claim 18, wherein reducing said potential difference comprises: coupling the inverter between the word line and a node connecting read ports of the N data storage circuits.

20. A system, comprising:
a processor;
a word line; and
a memory circuit which forms at least a portion of a register coupled to the processor, the memory circuit including a plurality of memory cells coupled to the word line, each cell including:
(a) N data storage circuits, where N≧1; and
(b) an inverter coupled between the word line and the N data storage circuits, wherein the inverter inverts a signal on the word line and inputs the inverted signal into read ports of the N data storage circuits.

21. A system, comprising:
a processor;
a word line; and
a memory circuit including one or more memory cells, each cell including:
(a) N data storage circuits, wherein N≧2; and
(b) an inverter coupled between the word line and the N data storage circuits, each of the N data storage circuits including a read port and a keeper circuit to store a voltage corresponding to a logical value received from a respective one of a plurality of bit lines; and
(c) a node connecting the read ports of the N data storage circuits to the inverter, each of the read ports including an access transistor coupled to the inverter and a pass transistor coupled between the access transistor and the keeper circuit.

22. The system of claim 21, wherein the inverter inverts a signal on the word line and inputs the inverted signal into the N data storage circuits.

23. A memory circuit, comprising:
a word line;
a memory cell including N data storage circuits, where N≧2; and
an inverter coupled between the word line and the N data storage circuits in the memory cell, wherein the inverter inverts a word-line signal for input into the N data storage circuits,
wherein each of the N data storage circuits includes a read port and a keeper circuit to store a voltage corresponding to a logical value received from a respective one of a plurality of bit lines, and
wherein the memory cell further includes a node connecting the read ports of the N data storage circuits to the inverter, each of the read ports including an access transistor coupled to the inverter and a pass transistor coupled between the access transistor and the keeper circuit.

24. The memory circuit of claim 23, wherein the inverter is located within the memory cell.

* * * * *